(12) United States Patent
Ozaki

(10) Patent No.: US 11,128,295 B1
(45) Date of Patent: Sep. 21, 2021

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kaoru Ozaki, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/021,530

(22) Filed: Sep. 15, 2020

(30) Foreign Application Priority Data

Mar. 19, 2020 (JP) .............................. JP2020-049990

(51) Int. Cl.
*H03B 1/00* (2006.01)
*H03K 3/00* (2006.01)
*H03K 17/687* (2006.01)
*H03K 17/08* (2006.01)

(52) U.S. Cl.
CPC ......... *H03K 17/6871* (2013.01); *H03K 17/08* (2013.01)

(58) Field of Classification Search
CPC ..................... H03K 17/6871; H03K 17/08

USPC .......................................................... 327/109
See application file for complete search history.

(56) References Cited

U.S. PATENT DOCUMENTS

| | | | |
|---|---|---|---|
| 9,667,245 B2 | 5/2017 | De Rooij et al. | |
| 2008/0315246 A1 | 12/2008 | Ueno et al. | |
| 2012/0306545 A1* | 12/2012 | Machida | H02M 1/08 327/109 |
| 2013/0278300 A1* | 10/2013 | Domingo | H03K 17/122 327/109 |
| 2019/0173307 A1* | 6/2019 | Zhao | H02J 7/0068 |

FOREIGN PATENT DOCUMENTS

| | | |
|---|---|---|
| JP | H11205112 A | 7/1999 |
| JP | 2009005187 A | 1/2009 |
| JP | 2017537584 A | 12/2017 |

* cited by examiner

*Primary Examiner* — Metasebia T Retebo
(74) *Attorney, Agent, or Firm* — Kim & Stewart LLP

(57) ABSTRACT

A semiconductor device includes a first terminal, a second terminal, a first transistor, and a switching circuitry. In the first transistor, an anode of a body diode is connected to the first terminal, and a cathode of the body diode is connected to the second terminal. The switching circuitry is connected between a gate and a source of the first transistor, and switches a connection state between the gate and the source of the first transistor.

8 Claims, 6 Drawing Sheets

SEMICONDUCTOR DEVICE

CROSS REFERENCE TO RELATED APPLICATIONS

This application is based upon and claims the benefit of priority from the prior Japanese Patent Application No. 2020-049990, filed on Mar. 19, 2020, the entire contents of which are incorporated herein by reference.

FIELD

The embodiments of the present invention relate to a semiconductor device.

BACKGROUND

A boosting circuit is widely used for boosting an input voltage in an electronic circuit. In the boosting circuit obtained by a bootstrap method, a DMOS (Double-Diffused Metal-Oxide-Semiconductor Field-Effect-Transistor) being a high withstand voltage element is sometimes used as a rectifier. When a body diode of the DMOS is used as the rectifier, it is necessary to fill an ESD (Electrostatic Discharge) withstand capacity (or surge withstand capacity).

For example, in order to increase the ESD withstand capacity of the DMOS, there is a configuration in which when a surge occurs in a drain by connecting a resistor between a gate and a source, current is released by turning the DMOS on. In this case, the use between terminals where a voltage variation is large causes the DMOS to be turned on in a case of a steep change, resulting in that a large current flows temporarily on a power supply side of the boosting circuitry. This sometimes affects characteristics of a semiconductor device. Further, as another configuration, there is a configuration in which the gate and the source of the DMOS are short-circuited. When the gate and the source of the DMOS are short-circuited, current can be suppressed to flow from a cathode to an anode of the body diode in a case where a rapid voltage variation occurs, but a formation area of the DMOS is required to be sufficiently large in order to increase the ESD withstand capacity. Thus, it is difficult to fill a sufficient ESD withstand capacity while reducing the formation area of the DMOS.

DETAILED DESCRIPTION

According to one embodiment, a semiconductor device includes a first terminal, a second terminal, a first transistor, and a switching circuitry. In the first transistor, an anode of a body diode is connected to the first terminal, and a cathode of the body diode is connected to the second terminal. The switching circuitry is connected between a gate and a source of the first transistor, and switches a connection state between the gate and the source of the first transistor.

Hereinafter, embodiments will be explained with reference to the drawings. Note that regarding a configuration except a bootstrap circuitry or an ESD protection switching circuitry which achieves control of a DMOS, detailed explanation is omitted in some cases. Further, in an electric potential or current of each terminal, a subscript is represented as a lower-case letter as represented as Vdd with respect to a terminal VDD.

First Embodiment

Figure 1:
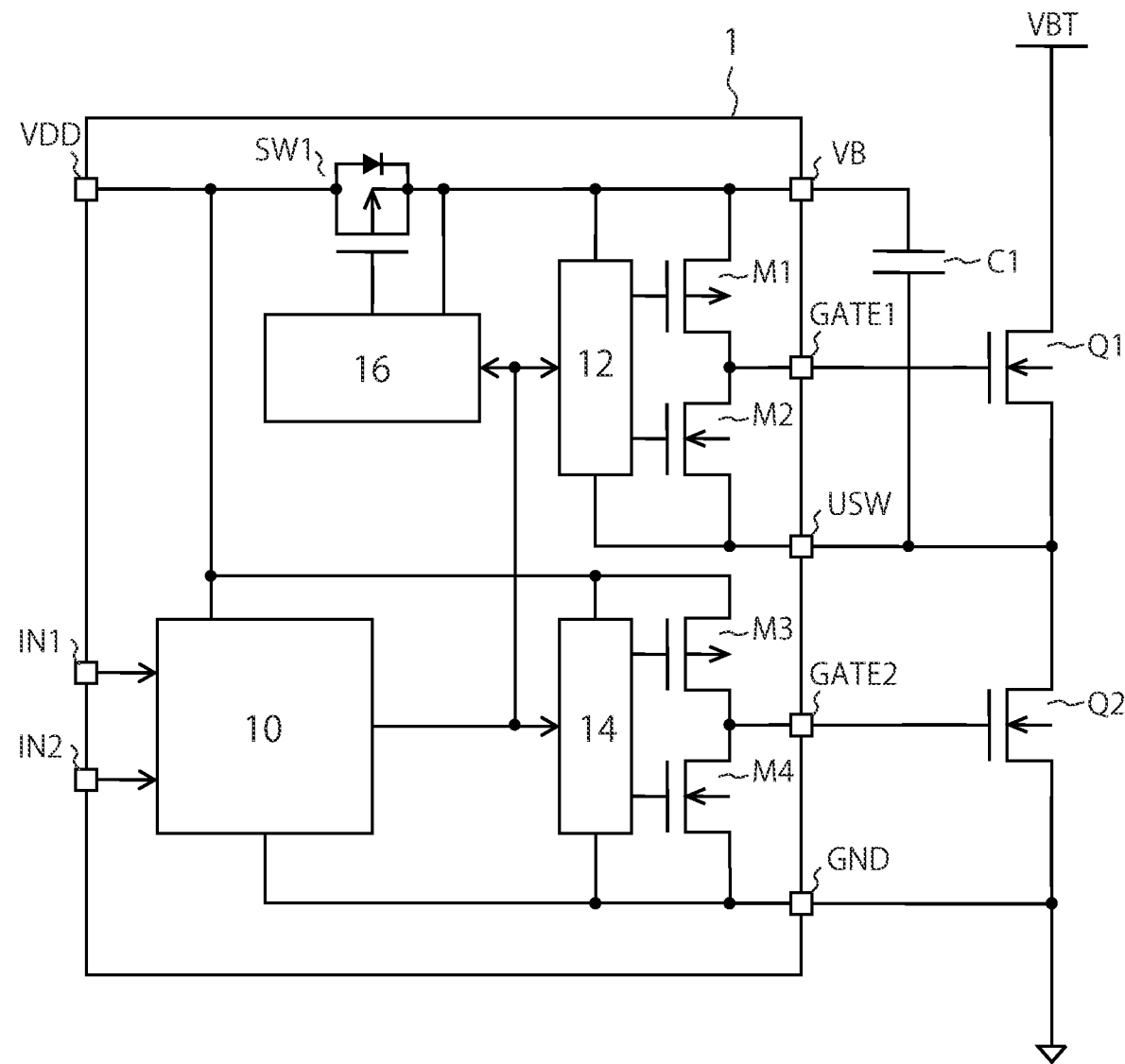
FIG. 1 is a diagram illustrating one example of a circuitry of a semiconductor device according to one embodiment.

FIG. 1 is a circuit diagram schematically illustrating a circuitry of a semiconductor device 1 according to a first embodiment. The semiconductor device 1 includes a control circuitry 10, a first driver 12, transistors M1, M2, a second driver 14, transistors M3, M4, a switch SW1, and a bootstrap switching circuitry 16.

The semiconductor device 1 outputs drive signals to transistors Q1, Q2 each being, for example, a MOSFET based on input signals In1, In2. For example, the transistor Q1 is a high-side switch (a first switching element), and the transistor Q2 is a low-side switch (a second switching element).

The semiconductor device 1 includes a terminal VDD and a terminal GND as terminals to input a power supply voltage, and further includes terminals IN1, IN2 to which the input signals to control are input and terminals GATE 1, GATE 2, VB, USW being output terminals. The terminal GATE 1 is connected to a gate of the transistor Q1 and the terminal GATE 2 is connected to a gate of the transistor Q2 respectively. A capacitor C1 provided outside is connected between the terminal VB and the terminal USW. This capacitor C1 operates as a bootstrap capacitor for driving the high-side transistor Q1.

The transistors Q1, Q2 are each, for example, an n-type MOSFET. In the transistor Q1, a drain is connected to a voltage source VBT, the gate is connected to the terminal GATE1, and a source is connected to the terminal USW and a drain of the transistor Q2. In the transistor Q2, a drain is connected to the source of transistor Q1 and the terminal USW, the gate is connected to the terminal GATE2, and a source is grounded. Then, to the terminal USW, namely, between the drain of the transistor Q1 and the source of the transistor Q2, a non-illustrated load is connected. The transistors Q1, Q2 are switched appropriately by the drive signals controlled by the semiconductor device 1, thereby providing a voltage or current larger than the drive signals.

The control circuitry 10 controls the first driver 12 and the second driver 14 based on the signals input from the terminals IN1, IN2. The control circuitry 10 processes the signals In1, In2 input from the terminals IN1, IN2 so that the first driver 12 and the second driver 14 do not output the drive signals at the same time, for example. In such a manner, the control circuitry 10 controls an output of the semiconductor device 1 so that the drive signals for the transistors Q1, Q2 are output to be pseudo-exclusive. There is no limitation on the kinds of signals used as the signals In1, In2, but in this embodiment, explanation is made on the premise that the signals are each a signal in which a voltage takes two values of H and L. There is no limitation on a relationship between signal states of the signals In1, In2 and continuity states of the transistors Q1, Q2, but for example, control is performed so that the transistor Q1 is turned on in synchronization with the signal In1 becoming H, and the transistor Q2 is turned on in synchronization with the signal In2 becoming H.

Here, to be pseudo-exclusive includes avoiding both the transistors Q1, Q2 from being turned on at a timing of switching in addition to switching on/off of the transistors Q1, Q2 exclusively at exactly the same moment. That is, it is a concept of also including at least one transistor being off at any timing. The control circuitry 10 may include a dead time control circuitry which performs control so that neither the transistor Q1 nor the transistor Q2 is turned on at the same time as described above. Further, a Schmitt trigger which removes fluctuation, noise, or the like in the signals In1, In2 may be included.

The first driver 12 is a circuitry which drives the transistors M1, M2 so as to output the drive signal for the high-side transistor Q1. The transistor M1 is, for example, a p-type MOSFET, the transistor M2 is, for example, an n-type MOSFET, and a CMOS (Complementary MOSFET) is formed by these two transistors M1, M2. Then, a common drain of the two transistors forming this CMOS is connected to the terminal GATE1. That is, these transistors M1, M2 operate as a current buffer in which an electric potential of their drains is output as a drive voltage for the transistor Q1.

In the transistor M1, a source is connected to a source of the switch SW1 and the terminal VB, a gate is connected to the first driver 12, and a drain is connected to a drain of the transistor M2 and the terminal GATE1. In the transistor M2, the drain is connected to the drain of the transistor M1 and the terminal GATE1, a gate is connected to the first driver 12, and a source is connected to the terminal USW being at a high-side lower level.

The second driver 14 is a circuitry which drives the transistors M3, M4 so as to output the drive signal for the low-side transistor Q2. The transistor M3 is, for example, a p-type MOSFET. The transistor M4 is, for example, an n-type MOSFET. A CMOS is formed by these two transistors. A common drain of the two transistors forming this CMOS is connected to the GATE2 terminal. That is, these transistors M3, M4 operate as a current buffer in which an electric potential of their drains is output as a drive voltage for the transistor Q2.

Here, because a voltage which drives the high-side transistor Q1 is generally higher than a voltage which drives the low-side transistor Q2 by, for example, as much as Vbt, the electric potentials of the drains of the transistors M1 to M4 are required to be controlled according to the above.

The switch SW1 is configured to include, for example, a p-type DMOS connected between the terminal VDD and the terminal VB. In the DMOS of the switch SW1, a drain is connected to the terminal VDD, a gate is connected to a source via the bootstrap switching circuitry 16, and the source is connected to the terminal VB. That is, in the switch SW1, an anode of a parasitic diode (body diode) is connected to the terminal VDD, and a cathode of the parasitic diode is connected to the terminal VB. This switch SW1 is switched on and off based on, for example, Vdd and Vb, and, a gate-source voltage caused by the bootstrap switching circuitry 16.

When the switch SW1 is on, current can flow from the drain to the source, and in this case, due to Vdd>Vb, current flows from the terminal VDD to the terminal VB. When the switch SW1 is off, the switch SW1 operates as a diode which operates so as to prevent current from flowing from terminal VB to the terminal VDD by using its parasitic diode.

The bootstrap switching circuitry 16 is a circuitry which controls whether to insert a resistor R1 between the gate and the source of this switch SW1 or to pass through the resistor R1 by a short circuit. The bootstrap switching circuitry 16 is connected to the control circuitry 10 and further connected between the gate and the source of the switch SW1. For example, the bootstrap switching circuitry 16 controls a voltage applied to the gate and controls a voltage between the gate and the source into an appropriate value in the above-described switch SW1.

Figure 2:
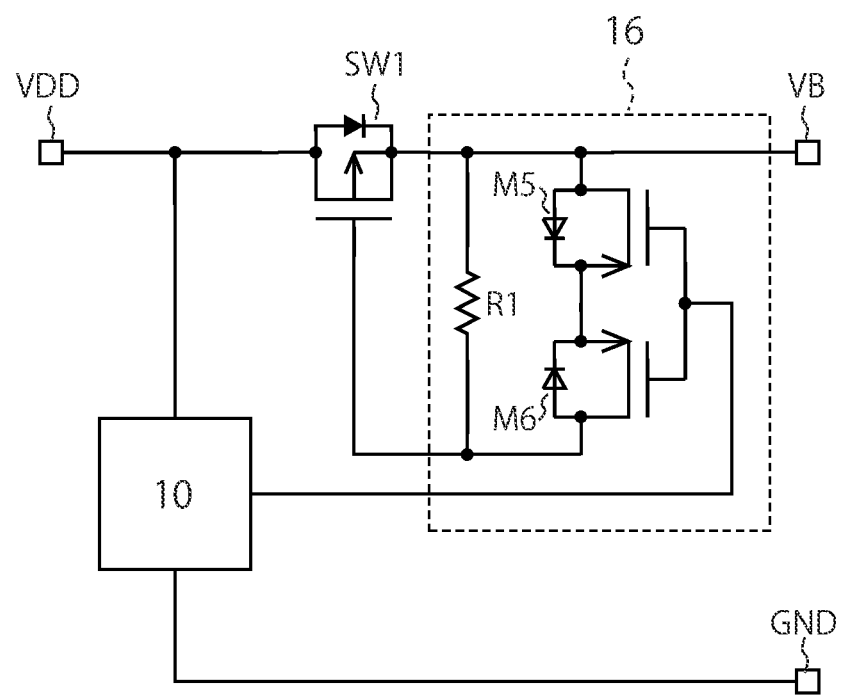
FIG. 2 is a diagram illustrating one example of a bootstrap circuitry in FIG. 1.

FIG. 2 is a circuitry diagram illustrating one example of the bootstrap switching circuitry 16. Incidentally, in this FIG. 2, an illustration of a circuitry except a main circuitry connected to the bootstrap switching circuitry 16 is omitted.

The bootstrap switching circuitry 16 includes transistors M5, M6, and the resistor R1. The resistor R1, and, the transistors M5, M6 connected in series are provided in parallel between the gate and the source of the switch SW1 as indicated below.

The transistors M5, M6 are each formed by, for example, a p-type MOSFET, and their sources are connected to each other and their gates are connected to each other. In the transistor M5, a drain is connected to the source of the switch SW1. In the transistor M6, a drain is connected to gate of the switch SW1.

The resistor R1 is provided between the source and the gate of the switch SW1. That is, the resistor R1 is connected between the drain of the transistor M5 and the drain of the transistor M6.

The operation of the semiconductor device 1 at a time of ESD application will be explained.

In one example, the control circuitry 10 outputs a control signal so that the transistors M5, M6 are turned off at a timing at which ESD is applied.

By performing the control in such a manner, the gate and the source of the switch SW1 are connected via the resistor R1 at the timing at which the ESD is applied. In this case, an electric potential of the gate of the switch SW1 is lower than an electric potential of the source thereof, resulting in that the switch SW1 is self-turned on. At this time, the switch SW1 releases current, and can keep an ESD withstand capacity high. Further, since the sources are connected to each other, the transistors M5, M6 get rid of a flow of current through parasitic diodes of the transistors M5, M6, which does not cause a cramp between the gate and the source of the switch SW1. Note that there is no limitation on a method in which the semiconductor device 1 detects the ESD. Further, a timing at which the control circuitry 10 outputs the control signal by which the transistors M5, M6 are turned off may be after a predetermined time from the input signals In1, In2.

On the other hand, at a time of normal operation, the transistors M5, M6 are turned on, resulting in a short circuitry between the gate and the source of the switch SW1. This causes the switch SW1 to be turned off and makes it possible to avoid a flow of current from the terminal VB to the terminal VDD when the transistor Q1 is turned on to make an electric potential of the terminal USW high.

The operation of the semiconductor device 1 will be explained by using FIG. 1, FIG. 2.

First, in synchronization with switching of the input signal In2 to H, the GATE2 becomes H on the basis of a ground point. In this case, L is input as the input signal In1, and the GATE1 becomes L on the basis of the ground point. The transistor Q1 is turned off and the transistor Q2 is turned on, and the electric potential of the terminal USW becomes a ground potential. As a result, an electric potential of the terminal VB becomes Vdd−Vf1, and the capacitor C1 is charged. Here, the Vf1 indicates a voltage drop in the switch SW1. For sake of simplicity, to an electric potential which appears in each terminal, a contribution portion of voltage drops of the transistors Q1, Q2 is omitted.

Next, in synchronization with switching of the input signal In2 to L, the GATE2 becomes L. Subsequently, the input signal In1 is switched to H, and the GATE1 becomes H on the basis of the terminal USW. The electric potential of the terminal USW gradually rises to finally become Vbt. As a result, the electric potential of the terminal VB is boosted to Vbt+Vdd−Vf1. At this timing, the switch SW1 prevents current from flowing from the terminal VB to the terminal VDD as a diode. For this reason, a voltage of Vdd−Vf1 is held between the terminal VB and the terminal USW by the capacitor C1.

After this, the GATE1 becomes H/L in synchronization with the input signal In1 and the transistor Q1 is turned on/off, and the GATE2 becomes H/L in synchronization with the input signal In2 and the transistor Q2 is turned on/off. In such a manner, the semiconductor device 1 operates as a circuitry which drives output transistors in a half bridge.

During such normal operation, the transistors M5, M6 are on, namely, the gate and the source of the switch SW1 are short-circuited, and the switch SW1 operates as the diode, and it is therefore possible to avoid the flow of current from the terminal VB to the terminal VDD as described above.

Thus, the switch SW1 and the capacitor C1 operate as a bootstrap circuitry in the semiconductor device 1, and provide a high gate voltage necessary for operation control of the high-side transistor Q1.

A timing of inserting the resistor R1 between the gate and the source of the switch SW1 is not limited to the time of ESD application. In another example, the control circuitry 10 outputs the control signal so that the transistors M5, M6 are turned off when the transistor Q1 is turned off and the transistor Q2 is turned on. When the semiconductor device 1 performs the normal operation, the switch SW1 makes current flow from the source to the drain by using the parasitic diode and charges the capacitor C1 even though the resistor R1 is inserted. When the ESD is applied to the semiconductor device 1, a drain-source voltage of the switch SW1 becomes large. The switch SW1 is self-turned on to release current, and can keep the withstand capacity of ESD high.

The control circuitry 10 outputs the control signal so that the transistors M5, M6 are turned on when the transistor Q1 is turned on and the transistor Q2 is turned off. As described above, when the semiconductor device 1 performs the normal operation, the switch SW1 operates as the diode.

As described above, according to this embodiment, in the switch SW1 which functions as a bootstrap diode and its drive circuitry, when the ESD is applied, the connection between the gate and the source via the resistor R1 causes a gate voltage to drop, and current thereby flows from the source to the drain. As a result, it becomes possible to increase the ESD withstand capacity. On the other hand, at a time of normal use, due to the short circuitry between the gate and the source of the switch SW1, the switch SW1 operates as the diode. Thus, it is possible to reduce a formation area of the DMOS provided for the switch SW1 as compared with a case where the ESD withstand capacity is filled and the gate and the source are short-circuited without passing through the bootstrap switching circuitry 16.

Second Embodiment

In the above-described first embodiment, the switch between the terminal VDD and the terminal VB has been a p-type DMOS, but this may be an n-type DMOS. In the following explanation, components denoted by the same reference signs as those in FIG. 1, FIG. 2 operate similarly to those in the above-described first embodiment, thus omitting detailed explanation thereof.

Figure 3:
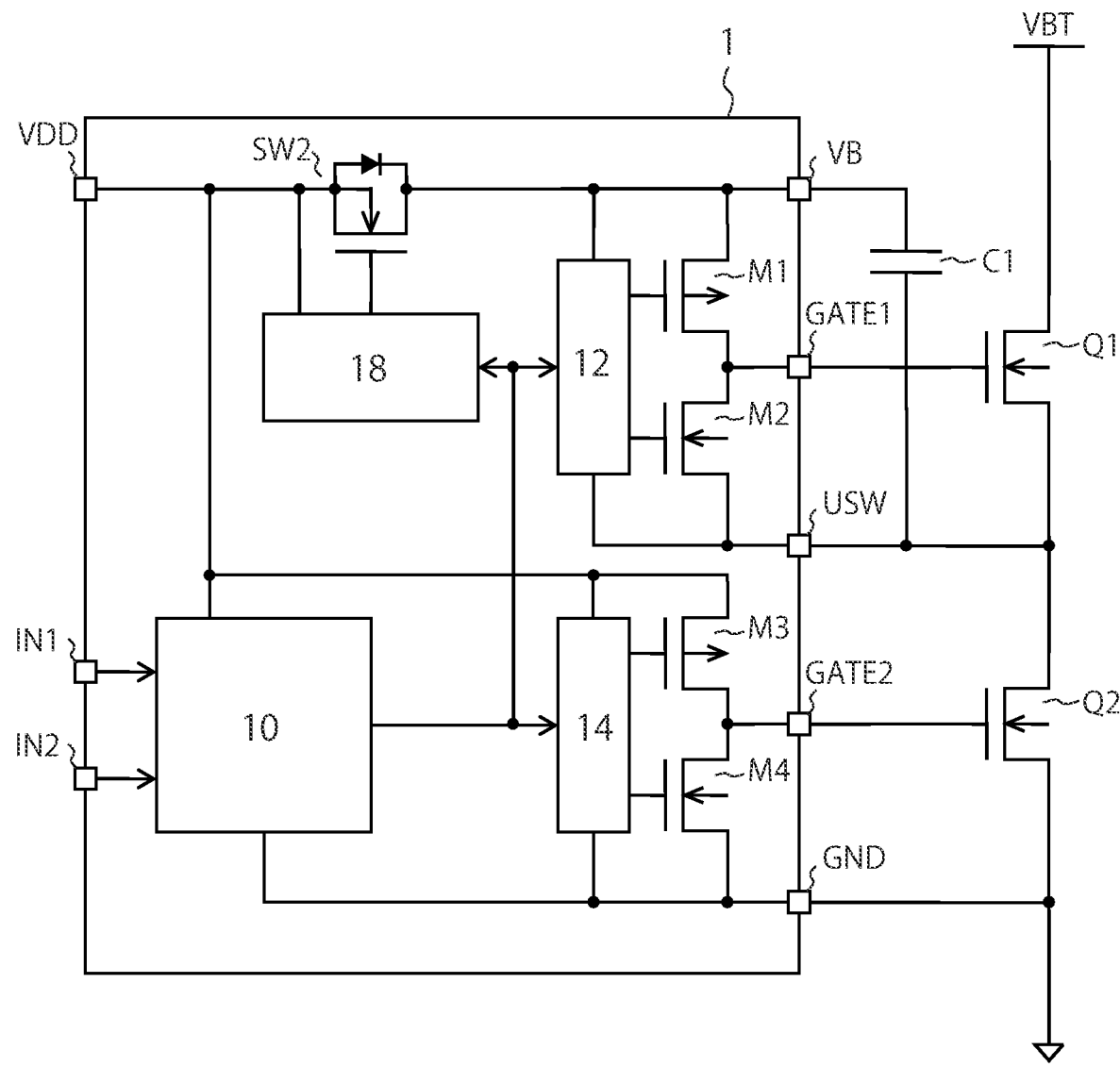
FIG. 3 is a diagram illustrating one example of a circuitry of a semiconductor device according to one embodiment.

FIG. 3 is a circuitry diagram illustrating a semiconductor device 1 in which a switch is the n-type DMOS. In this embodiment, the semiconductor device 1 includes a control circuitry 10, a first driver 12, transistors M1, M2, a second driver 14, transistors M3, M4, a switch SW2, and a bootstrap switching circuitry 18.

The switch SW2 is configured to include, for example, an n-type DMOS connected between a terminal VDD and a terminal VB. In the DMOS of the switch SW2, a drain is connected to the terminal VB, a gate is connected to a source via the bootstrap switching circuitry 18, and the source is connected to the terminal VDD. This switch SW2 is switched on and off based on, for example, Vdd and Vb, and, a gate-source voltage caused by the bootstrap switching circuitry 18.

When the switch SW2 is on, current can flow from the drain to the source, but in this case, due to Vdd>Vb, a parasitic diode causes current to flow from the terminal VDD to the terminal VB. When the switch SW2 is off, the switch SW2 operates as a diode which operates so as to prevent current from flowing from the terminal VB to the terminal VDD by using its parasitic diode.

The bootstrap switching circuitry 18 is a circuitry which controls whether to insert a resistor R2 between the gate and the source of this switch SW2 or to pass through the resistor R2 by a short circuitry between the gate and the source. The bootstrap switching circuitry 18 is connected to the control circuitry 10 and further connected between the gate and the source of the switch SW2. For example, the bootstrap switching circuitry 18 controls a voltage applied to the gate and controls a voltage between the gate and the source into an appropriate value in the above-described switch SW2.

Figure 4:
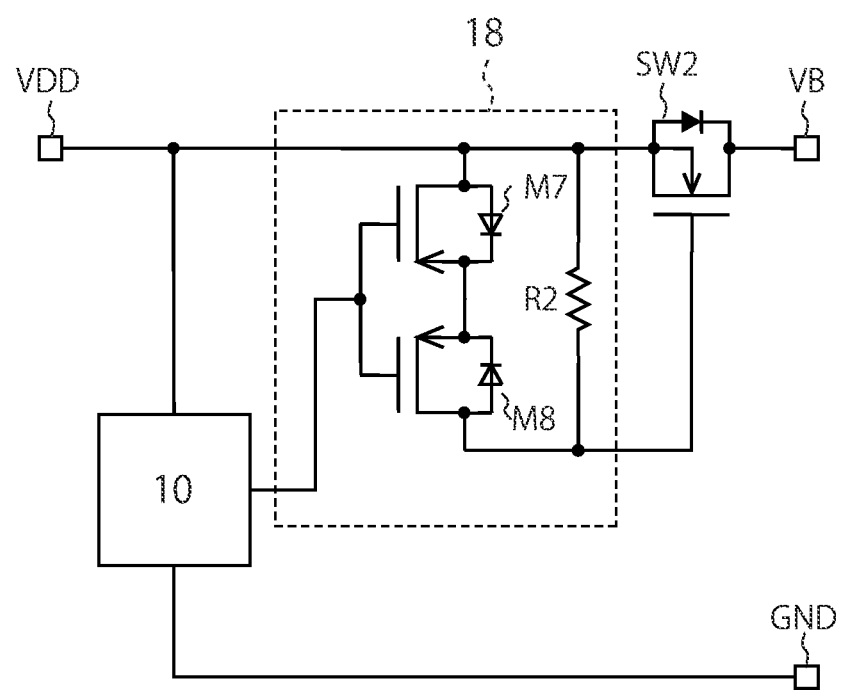
FIG. 4 is a diagram illustrating one example of a bootstrap circuitry in FIG. 3.

FIG. 4 is a circuit diagram illustrating one example of the bootstrap switching circuitry 18. Incidentally, in this FIG. 4, an illustration of a circuitry except a main circuitry connected to the bootstrap switching circuitry 18 is omitted.

The bootstrap switching circuitry 18 includes transistors M7, M8, and the resistor R2. The transistors M7, M8, and, the resistor R2 are provided in parallel between the gate and the source of the switch SW2 as indicated below.

The transistors M7, M8 are each formed by, for example, a p-type MOSFET, and their sources are connected to each other and their gates are connected to each other. In the transistor M7, a drain is connected to the source of the switch SW2. In the transistor M8, a drain is connected to the gate of the switch SW2.

The resistor R2 is provided between the source and the gate of the switch SW2. That is, in the resistor R2, one end is connected to the drain of the transistor M7, and the other end is connected to the drain of the transistor M8.

At a timing at which ESD is applied, the control circuitry 10 outputs a control signal so that the transistors M7, M8 are turned off. By performing control in such a manner, the gate and the source of the switch SW2 are connected via the resistor R2 at the timing at which the ESD is applied. In this case, an electric potential of the gate is lower than an electric potential of the source. This causes the switch SW2 to be turned on, and allows a withstand capacity of ESD to be kept high. Further, since common connection is performed between the sources, the transistors M7, M8 get rid of a flow of current between the drains of the transistors M7, M8, which does not cause a cramp between the gate and the source of the switch SW2 under such a situation.

On the other hand, at a time of normal operation, the transistors M7, M8 are turned on, resulting in a short circuit between the gate and the source of the switch SW2. This causes the switch SW2 to be turned off and makes it possible to avoid a flow of current from the terminal VB to the terminal VDD when the transistor Q1 is turned on to make an electric potential of a terminal USW high.

Thus, the switch SW2 and the bootstrap switching circuitry 18 operate as a bootstrap circuitry in the semiconductor device 1.

The operation of the semiconductor device 1 will be explained by using FIG. 3, FIG. 4.

First, when a GATE2 becomes H on the basis of a ground point in synchronization with an input signal In2, the transistor Q2 is turned on, and the electric potential of the terminal USW becomes a ground potential. As a result, an electric potential of the terminal VB becomes Vdd−Vf2, and the capacitor C1 is charged. Here, the Vf2 indicates a voltage drop in the switch SW2.

Next, the GATE2 becomes L in synchronization with an input signal In1, and subsequently, when a GATE1 becomes H on the basis of the terminal USW, an electric potential of the terminal USW gradually rises to finally become Vbt. As a result, the electric potential of the terminal VB is boosted to Vbt+Vdd−Vf2. At this timing, the switch SW2 prevents current from flowing from the terminal VB to the terminal VDD as a diode. For this reason, Vdd−Vf2 is held in a voltage between the terminal VB and the terminal USW by the capacitor C1.

After this, the GATE1 becomes H/L in synchronization with the input signal In1 and the transistor Q1 is turned on/off, and the GATE2 becomes H/L in synchronization with the input signal In2 and the transistor Q2 is turned on/off. In such a manner, the semiconductor device 1 operates as a half bridge.

During such normal operation, the transistors M7, M8 are on, namely, the gate and the source of the switch SW2 are short-circuited, and the switch SW2 operates as the diode, and it is therefore possible to avoid the flow of current from the terminal VB to the terminal VDD as described above.

As described above, according to this embodiment, in the switch SW2 which functions as a bootstrap diode and its drive circuitry, when ESD is applied, the connection between the gate and the source via the resistor R2 causes a gate voltage to drop, and current thereby flows from the source to the drain. As a result, it becomes possible to increase an ESD withstand capacity. On the other hand, at a time of normal use, due to the short circuit between the gate and the source of the switch SW2, the switch SW2 operates as the diode. Thus, it is possible to reduce a formation area of the DMOS provided for the switch SW2 as compared with a case where the ESD withstand capacity is filled and the gate and the source are short-circuited without passing through the bootstrap switching circuitry 18.

In general, the p-type DMOS enables a smaller area of the DMOS in the configuration illustrated in FIG. 1 because the formation area required to have an equal withstand voltage is smaller than that of the n-type DMOS. Meanwhile, bring the bootstrap switching circuitry 18 close to not a drive side but a power supply side as in FIG. 3 makes it possible to reduce an influence from the bootstrap switching circuitry 18 to the terminal VB. This allows the above-described semiconductor device 1 according to the first embodiment and the semiconductor device 1 according to the second embodiment to be separately used depending on their purposes. In both the embodiments, it is possible to demonstrate the above-described effects.

Third Embodiment

In each embodiment described above, a configuration including the DMOS on the high side has been described, but a third embodiment presents a configuration also including a DMOS on the low side. This is that a steep voltage change dV/dt can also occur in a terminal USW and the configuration of this embodiment deals with protecting a circuitry from such a voltage change.

Figure 5:
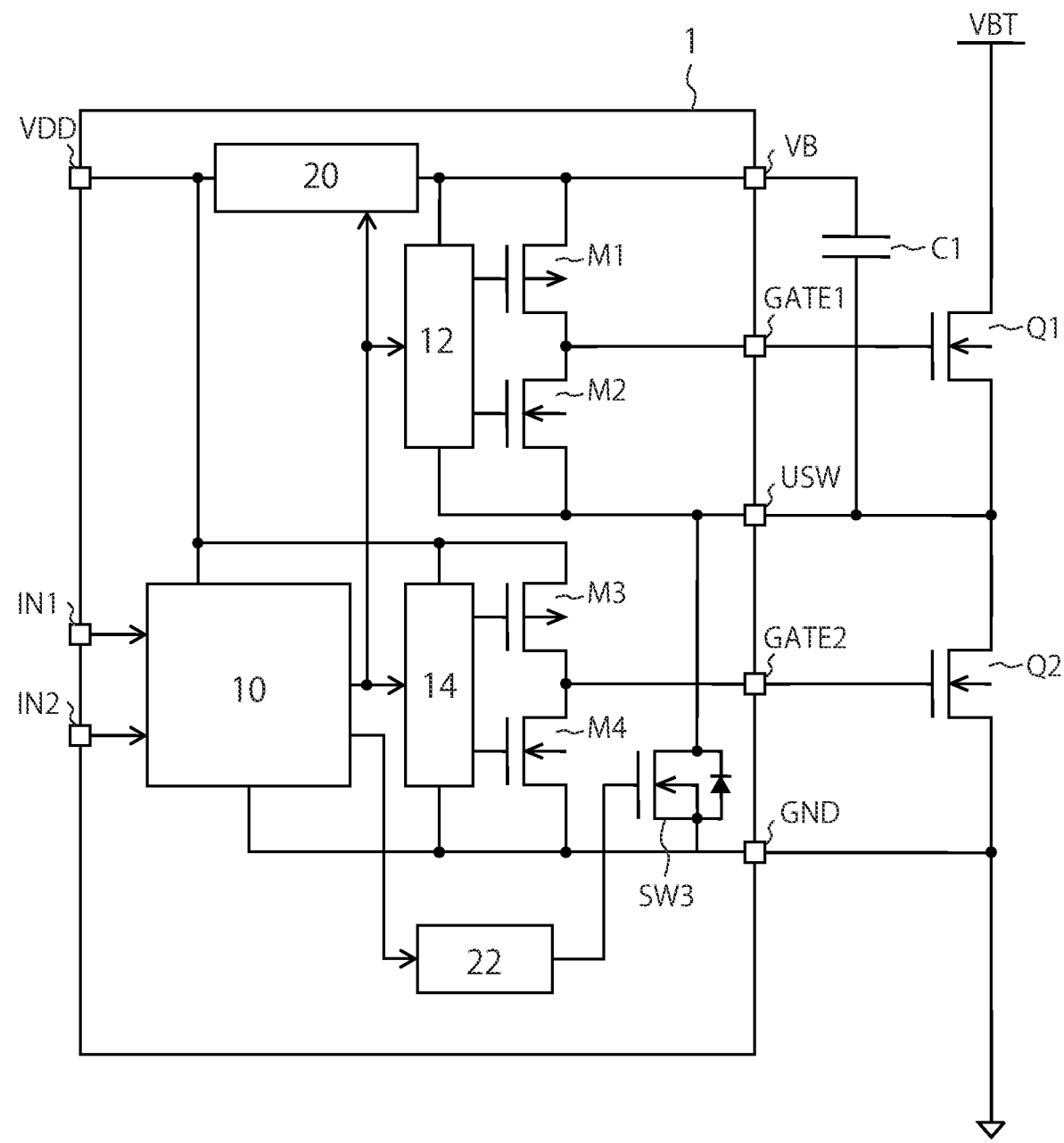
FIG. 5 is a diagram illustrating one example of a circuitry of a semiconductor device according to one embodiment.

FIG. 5 is a circuit diagram schematically illustrating a circuitry of a semiconductor device 1 according to the third embodiment. The semiconductor device 1 includes a control circuitry 10, a first driver 12, transistors M1, M2, a second driver 14, transistors M3, M4, a bootstrap circuitry 20, a switch SW3, and an ESD protection switching circuitry 22.

The bootstrap circuitry 20 is a circuitry which controls current at a time of boosting on the high side, and can be set as a configuration equal to the switch SW1 and the bootstrap switching circuitry 16 in the first embodiment or a configuration equal to the switch SW2 and the bootstrap switching circuitry 18 in the second embodiment.

The switch SW3 is configured to include an n-type DMOS connected between the terminal USW and a terminal GND. In the DMOS of the switch SW3, a drain is connected to the terminal USW, a gate is connected to a source via the ESD protection switching circuitry 22, and the source is connected to the terminal GND. This switch SW3 is switched on and off based on, for example, an electric potential of the USW and a gate-source voltage caused by the ESD protection switching circuitry 22.

When the switch SW3 is on, current flows from the terminal USW to the terminal GND. Further, when the switch SW3 is off, it operates as a diode so as to prevent current from flowing from the terminal USW to the terminal GND.

The ESD protection switching circuitry 22 is a circuitry which controls a gate-source voltage of this switch SW3. The ESD protection switching circuitry 22 is connected to the control circuitry 10 and further connected between the gate and the source of the switch SW3. For example, the ESD protection switching circuitry 22 controls a voltage applied to the gate in the above-described switch SW3, and controls a voltage between the gate and the source into an appropriate value.

Figure 6:
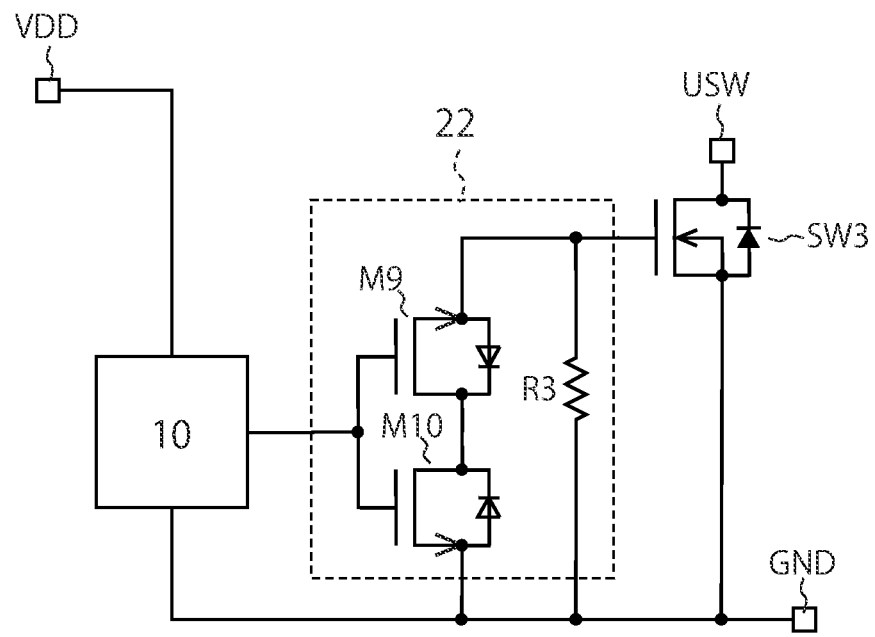
FIG. 6 is a diagram illustrating one example of an ESD protection switching circuitry in FIG. 5.

FIG. 6 is a circuitry diagram illustrating one example of the ESD protection switching circuitry 22. Incidentally, in this FIG. 6, an illustration of a circuitry except a main circuitry connected to the ESD protection switching circuitry 22 is omitted.

The ESD protection switching circuitry 22 includes transistors M9, M10, and a resistor R3. The transistors M9, M10, and, the resistor R3 are provided in parallel between the gate and the source of the switch SW3 as indicated below.

The transistors M9, M10 are each formed by, for example, an n-type MOSFET, and their drains are connected to each other and their gates are connected to each other. In the transistor M9, a source is connected to the gate of the switch SW3. In the transistor M10, a source is connected to the source of the switch SW3.

The resistor R3 is provided between the source and the gate of the switch SW3. That is, the resistor R3 is also connected between the source of the transistor M9 and the source of the transistor M10.

At a timing at which ESD is applied, the control circuitry 10 outputs a control signal so that the transistors M9, M10 are turned off. By performing control in such a manner, the gate and the source of the switch SW3 are connected via the resistor R3 at the timing at which the ESD is applied. In this case, an electric potential of the gate is higher than an electric potential of the source. This causes the switch SW3 to be turned on, and allows a withstand capacity of ESD to be kept high. Further, since common connection is performed between the drains, the transistors M9, M10 get rid of a flow of current between the sources of the transistors M9, M10, which does not cause a cramp between the gate and the source of the switch SW3 under such a situation.

On the other hand, at a time of normal operation, the transistors M9, M10 are turned on, resulting in a short circuit between the gate and the source of the switch SW3. This causes the switch SW3 to be turned off and makes it possible to avoid a flow of current from the terminal USW to the terminal GND when the transistor Q1 is turned on to make an electric potential of the USW high.

The operation of the semiconductor device 1 as a half bridge is omitted because it is similar to the operation indicated in the above-described embodiments.

As described above, according to this embodiment, in the switch SW3 which functions as a bootstrap diode and its drive circuitry, when ESD is applied, the connection between the gate and the source via the resistor R3 causes a gate voltage to be higher than a source voltage, and current thereby flows appropriately from the drain to the source. As a result, it becomes possible to increase an ESD withstand capacity. On the other hand, at a time of normal use, due to the short circuit between the gate and the source of the switch SW3, the switch SW3 operates as the diode. Thus, it is possible to reduce a formation area of the DMOS provided for the switch SW3 as compared with a case where the ESD withstand capacity is filled and the gate and the source are short-circuited without passing through the ESD protection switching circuitry.

Figure 7:
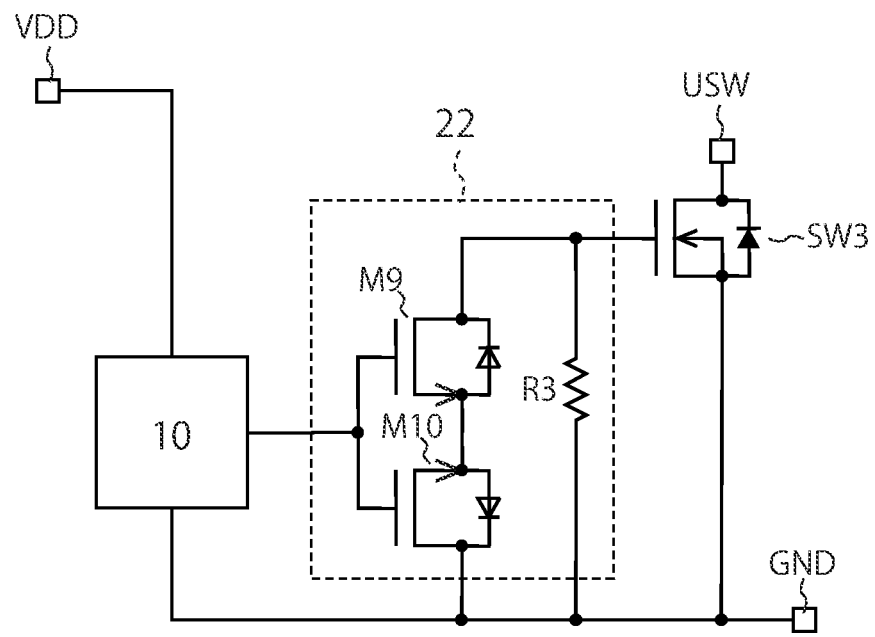
FIG. 7 is a diagram illustrating one example of the ESD protection switching circuitry in FIG. 5.

FIG. 7 is a diagram illustrating one modified example of the third embodiment. As illustrated in this FIG. 7, the two transistors included in the ESD protection switching circuitry 22 may have a configuration in which common connection is performed between their sources. Also in this case, it is possible to perform the operation similar to the above-described operation.

Incidentally, in this embodiment, for example, it is also possible to invert the polarity of the switch SW3 similarly to a difference between the first embodiment and the second embodiment. In this case, attention is also to be paid to an appropriate change in a configuration of the ESD protection switching circuitry 22.

In each of all the embodiments, a capacity of the capacitor C1 is appropriately set based on an external voltage and a load. On the other hand, this capacitor C1 may also be included in the semiconductor device 1 when the application is fixed, namely, the external voltage and the load are predetermined ones. In this case, the terminal VB may be removed from the semiconductor device 1.

The semiconductor devices 1 in all the embodiments can be each used as a half-bridge circuitry and applied to typical various devices such as, for example, a general-purpose DC-DC converter, an on-vehicle circuitry, and a motor driving circuitry.

In all the above-described embodiments, in the drawings and the explanation, some circuitry elements are sometimes omitted for the sake of clarity, but the embodiments of the present disclosure are not limited to this. For example, the semiconductor devices 1 may each further include a charge pump. Further, the polarities of the transistors are not limited to the above, and as long as the operation is properly secured, a part or all of the polarities may be switched. Further, the MOSFET has been described as the transistor as one example, but may be replaced with another transistor such as a bipolar in a range to enable suitable replacement with it.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first terminal;
   a second terminal;
   a first transistor in which an anode of a body diode is connected to the first terminal, and a cathode of the body diode is connected to the second terminal; and
   a switching circuitry connected between a gate and a source of the first transistor, which switches a connection state between the gate and the source of the first transistor, wherein the switching circuitry comprises:
   two transistors having a same channel type, in which forward directions of body diodes are opposite to each other and which are connected in series, the two transistors including:
      a second transistor for which one end is connected to the source of the first transistor, and
      a third transistor for which one end is connected to the other end of the second transistor, a gate of the third transistor being connected to a gate of the second transistor, and the other end of the third transistor being connected to the gate of the first transistor; and
   a resistor for which one end is connected to the one end of the second transistor and the other end of the resistor is connected to the other end of the third transistor.

2. The semiconductor device according to claim 1, further comprising:
   a gate driver circuitry connected to the second terminal, a third terminal, and a fourth terminal, which electrically connects the third terminal to one of the second terminal and the fourth terminal; and
   a control circuitry which controls the gate driver circuitry in response to a control signal input from at least one signal input terminal, wherein
   the first terminal is a terminal to which a power supply voltage is input.

3. The semiconductor device according to claim 2, wherein
   the second transistor and the third transistor are each a p-channel type MOS transistor.

4. The semiconductor device according to claim 3, wherein
   the first transistor is an n-type DMOS.

5. The semiconductor device according to claim 4, further comprising a first switching element and a second switching element connected in series with a contact therebetween, the first switching element and the second switching element being connected between a power supply and a ground, wherein:

the power supply is connected to an end portion on the first switching element side of the first and second switching elements and the ground is connected to an end on the second switching element side of the first and second switching element;

the second terminal is a terminal connected to the contact via a capacitor element;

the third terminal is a terminal connected to a control terminal of the first switching element; and the fourth terminal is a terminal connected to the contact.

6. The semiconductor device according to claim 3, further comprising a first switching element and a second switching element connected in series with a contact therebetween, the first switching element and the second switching element being connected between a power supply and a ground, wherein:

the power supply is connected to an end on the first switching element side of the first and second switching elements and the ground is connected to an end on the second switching element side of the first and second switching element;

the second terminal is a terminal connected to the contact via a capacitor element;

the third terminal is a terminal connected to a control terminal of the first switching element; and the fourth terminal is a terminal connected to the contact.

7. The semiconductor device according to claim 2, further comprising a first switching element and a second switching element connected in series with a contact therebetween, the first switching element and the second switching element being connected between a power supply and a ground, wherein:

the power supply is connected to an end on the first switching element side of the first and second switching elements and the ground is connected to an end on the second switching element side of the first and second switching element;

the second terminal is a terminal connected to the contact via a capacitor element;

the third terminal is a terminal connected to a control terminal of the first switching element; and the fourth terminal is a terminal connected to the contact.

8. A semiconductor device, comprising:

a first terminal;

a second terminal;

a first transistor in which an anode of a body diode is connected to the first terminal, and a cathode of the body diode is connected to the second terminal; and a switching circuitry connected between a gate and a source of the first transistor, which switches a connection state between the gate and the source of the first transistor, wherein the switching circuitry comprises:

two transistors having a same channel type, in which forward directions of body diodes are opposite to each other and which are connected in series, the two transistors including:

a second transistor for which one end is connected to the source of the first transistor, and a third transistor for which one end is connected to the other end of the second transistor, a gate of the third transistor being connected to a gate of the second transistor, and the other end of the third transistor being connected to the gate of the first transistor; and a resistor for which one end is connected to the one end of the second transistor and the other end of the resistor is connected to the other end of the third transistor, the semiconductor device further comprising:

a first switching element and a second switching element connected in series with the first switching element at a contact, wherein:

the first terminal is a terminal connected to the contact;

the second terminal is a grounded terminal; and the first transistor is an n-type DMOS.

* * * * *

UNITED STATES PATENT AND TRADEMARK OFFICE
CERTIFICATE OF CORRECTION

| | |
|---|---|
| PATENT NO. | : 11,128,295 B1 |
| APPLICATION NO. | : 17/021530 |
| DATED | : September 21, 2021 |
| INVENTOR(S) | : Kaoru Ozaki |

It is certified that error appears in the above-identified patent and that said Letters Patent is hereby corrected as shown below:

In the Claims

In Column 11, Claim 5, Line 4, please delete "portion".

Signed and Sealed this
Eighth Day of November, 2022

*Katherine Kelly Vidal*

Katherine Kelly Vidal
*Director of the United States Patent and Trademark Office*